United States Patent
Cho et al.

(10) Patent No.: US 7,489,565 B2
(45) Date of Patent: Feb. 10, 2009

(54) FLASH MEMORY DEVICE INCLUDING MULTI-BUFFER BLOCK

(75) Inventors: Ji-Ho Cho, Suwon-si (KR); Soo-Han Kim, Hwaseong-si (KR); June-Hong Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 48 days.

(21) Appl. No.: 11/762,797

(22) Filed: Jun. 14, 2007

(65) Prior Publication Data

US 2007/0297229 A1 Dec. 27, 2007

(30) Foreign Application Priority Data

Jun. 15, 2006 (KR) .................. 10-2006-0054029

(51) Int. Cl.
*G11C 7/10* (2006.01)
(52) U.S. Cl. .................. 365/189.05; 365/189.12; 365/185.23; 365/221
(58) Field of Classification Search ............ 365/189.05, 365/189.12, 185.23, 221
See application file for complete search history.

(56) References Cited

U.S. PATENT DOCUMENTS

| | | | | |
|---|---|---|---|---|
| 5,159,571 A | * | 10/1992 | Ito et al. ................ | 365/201 |
| 6,324,096 B1 | * | 11/2001 | Tomita ................... | 365/185.05 |
| 6,442,092 B1 | * | 8/2002 | Tomita .................. | 365/219 |
| 2002/0044484 A1 | * | 4/2002 | Tomita ................... | 365/185.05 |
| 2005/0226049 A1 | | 10/2005 | Jeong et al. | |
| 2006/0004970 A1 | | 1/2006 | Jeong et al. | |

FOREIGN PATENT DOCUMENTS

| | | |
|---|---|---|
| JP | 2004-326893 | 11/2004 |
| JP | 2006-024347 | 1/2006 |
| KR | 1020050099329 A | 10/2005 |
| KR | 1020060003258 A | 1/2006 |

* cited by examiner

*Primary Examiner*—Tuan T. Nguyen
(74) *Attorney, Agent, or Firm*—Volentine & Whitt, PLLC

(57) ABSTRACT

A flash memory device includes a memory cell array and a multi-buffer block which temporarily stores program data that are to be stored in the memory cell array, wherein the multi-buffer block includes a plurality of buffer circuits which store at least 2-word data, respectively. Each of the buffer circuits includes a plurality of registers which store two corresponding data bits among the at least 2-word data, respectively and scan logics corresponding to the registers, respectively, which scan a number of program data of a first word data among the at least 2-word data during a first scan interval, and which scan a number of program data of a second word data among the at least 2-word data based on the number of the program data of the first word data during a second scan interval.

10 Claims, 7 Drawing Sheets

FLASH MEMORY DEVICE INCLUDING MULTI-BUFFER BLOCK

CROSS-REFERENCE TO RELATED APPLICATIONS

A claim of priority is made under 35 U.S.C. § 119 to Korean Patent Application No. 10-2006-54029, filed on Jun. 15, 2006, the entire contents of which are hereby incorporated by reference.

BACKGROUND OF THE INVENTION

1. Field of the Invention

The present disclosure generally relates to a semiconductor memory device, and more particularly, to a flash memory device.

2. Description of the Related Art

Semiconductor memory devices are widely used to store data. Specifically, semiconductor memory devices are used in a wide variety of electronic equipment. The electronic equipment may range from satellite equipment to consumer electronic equipment. With the increasing demand for high speed but yet small size electronic equipment, there is an increasing demand for semiconductor memory devices that operate at higher speeds than before but are smaller in size.

The semiconductor memory devices are largely divided into volatile memory devices and non-volatile memory devices. Many differences exist between volatile memory devices and non-volatile memory devices. For example, volatile memory devices loose stored data in the event of power loss. However, non-volatile memory devices tend to retain stored data even in the event of a power loss.

Non-volatile memory devices include, for example, Magnetic Read Only Memory (MROM), Programmable Read Only Memory (PROM), Electrically Programmable Read Only Memory (EPROM), and Electrically Erasable Programmable Read Only Memory (EEPROM). An MROM, PROM, and EPROM may not easily erase and write data stored therein. This difficulty in writing data to and erasing data from these memory devices may make it difficult for non-sophisticated users to use these kinds of memory devices. On the other hand, EEPROM may electrically erase and write data such with relative ease. This ease in erasing and writing data has made the EEPROM a popular choice for a non-volatile memory device. In particular, a flash EEPROM (hereinafter, referred to as a flash memory) has a higher degree of integration compared to conventional EEPROM. Different types of flash memories are commercially available at this time. These types include, for example, a NAND flash memory and a NOR flash memory. NAND flash memories and NOR flash memories have different characteristics. For example, a NAND flash memory has a higher degree of integration than a NOR flash memory.

Generally, a NOR flash memory is used for storing codes and program data. Furthermore, as a device that includes a NOR flash memory requires increasing amounts of code and program data, the programming time for the device increases. This increase in programming time is generally due to the time taken in providing the data, addresses, and commands required for each programming operation to the device via the NOR flash memory. However, the programming time in this situation may be reduced by storing the data, addresses, and commands for each program operation in a buffer of the NOR flash memory. For example, data may be loaded into a buffer of the NOR flash memory, and then the loaded data may be programmed by a simultaneous programming unit (e.g., ×4, ×8, ×16, etc.) without the need to load data for each programming operation one at a time.

One will appreciate that the size of the buffer for temporarily storing the program data increases in proportion to an increase in the size of the code and program data. This means that the layout region of the NOR flash memory increases. There is therefore a need for reducing the size of the buffer in a flash memory device without reducing the amount of data and code that may be stored in the flash memory device.

SUMMARY

One aspect of the present disclosure includes a flash memory device. The device comprises a memory cell array and a multi-buffer block which temporarily stores program data that are to be stored in the memory cell array, wherein the multi-buffer block includes a plurality of buffer circuits which store at least 2-word data, respectively. Each of the buffer circuits comprises a plurality of registers which store two corresponding data bits among the at least 2-word data, respectively and scan logics corresponding to the registers, respectively, which scan a number of program data of a first word data among the at least 2-word data during a first scan interval, and which scan a number of program data of a second word data among the at least 2-word data based on the number of the program data of the first word data during a second scan interval.

BRIEF DESCRIPTION OF THE FIGURES

The accompanying figures are included to provide a further understanding of the present disclosure, and are incorporated in and constitute a part of this specification. The drawings illustrate exemplary embodiments of the present disclosure and, together with the description, serve to explain principles of the present disclosure. In the figures.

DETAILED DESCRIPTION OF EXEMPLARY EMBODIMENTS

Figure 1:
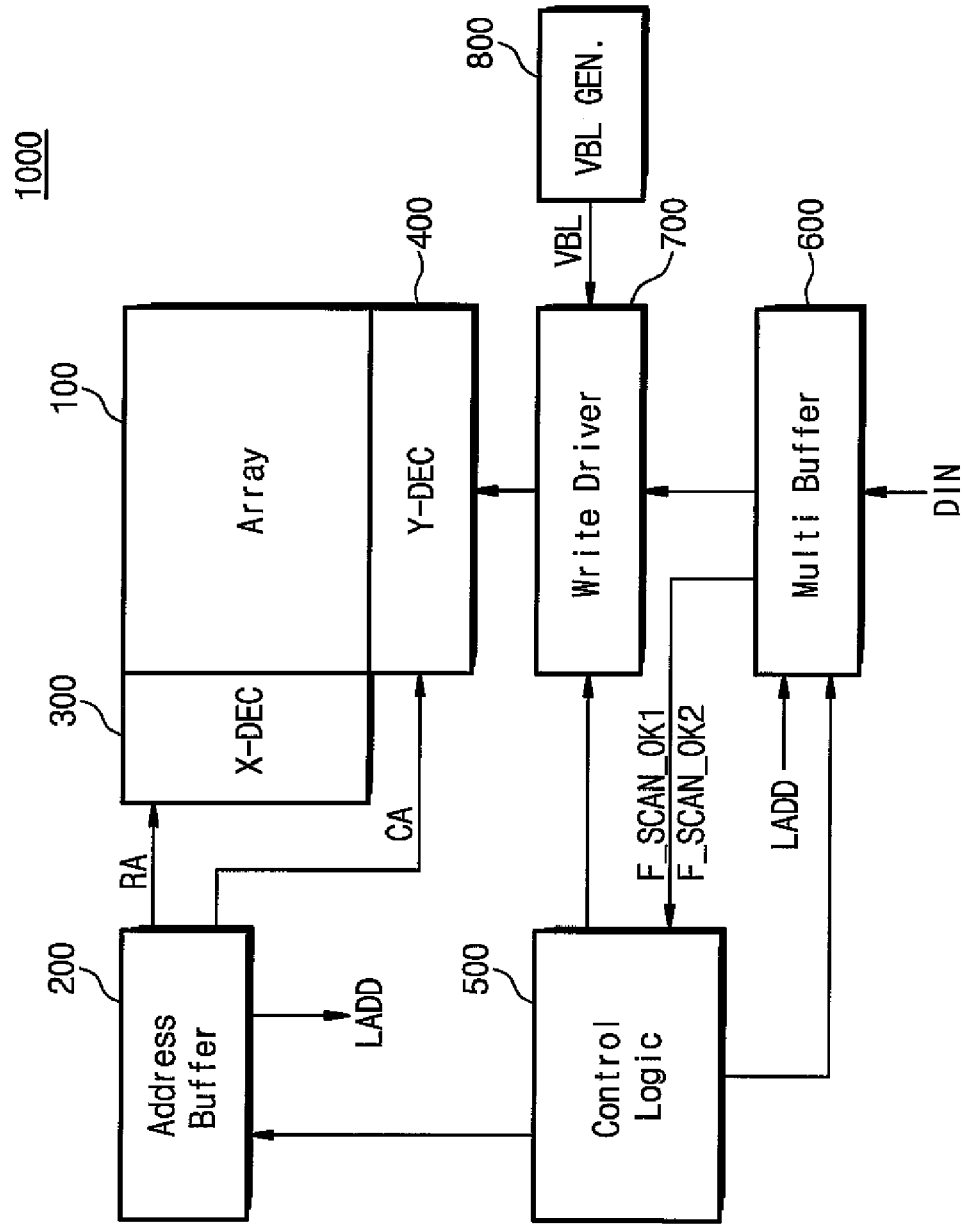
FIG. 1 is a block diagram of a flash memory device according to an exemplary disclosed embodiment.

Reference numerals are used for the embodiments of the present disclosure, and their examples are illustrated on the drawings. Like reference numerals refer to like elements throughout.

In the following description, a NOR flash memory device is used as a non-volatile memory device for illustrating characteristics and functions of the present disclosure. However, one skilled in the art will appreciate that the features disclosed in the present disclosure may be used in other memory devices. Furthermore, the detailed description may be amended or modified according to viewpoints and applications, not being out of the scope, technical idea and other objects of the present disclosure.

In the present disclosure, the term "multi-word data" represents a plurality of word data. For example, 2-word data may be formed of multiple data bits. That is, the 2-word data may be formed of 32 data bits.

FIG. 1 is a block diagram of a flash memory device according to an exemplary disclosed embodiment. As described above, while the flash memory device of the present disclosure is a NOR flash memory device, it will be apparent to those skilled in the art that the present disclosure is not limited to flash memory device. In general, the disclosed flash memory device receives a certain amount of data from an external device. Then, the disclosed flash memory device simultaneously programs a number of cells with the received data. That is, the cells store the received data. Furthermore, the flash memory device scans the stored data and outputs the scanned results to another device connected to the flash memory device.

Referring to FIG. 1, an exemplary flash memory device 1000 includes a memory cell array 100, an address buffer block 200, a row decoder block 300, a column decoder block 400, control logic block 500, a multi-buffer block 600, a write driver block 700, and a bit line voltage generating block 800.

The memory cell array 100, although not illustrated in the drawing, includes memory cells arranged in rows and columns, and each of the memory cells includes a well-known floating gate transistor. The address buffer block 200 is controlled by the control logic block 500. Furthermore, an external address is input from an external device into the multi-buffer block 600 as a load address LADD. In addition, row and column addresses provided from an external source during a data load interval are input into the row decoder block 300 and the column decoder block 400, respectively. The row decoder block 300 decodes a row address RA outputted from the address buffer block 200 and selects at least one row from the rows according to the decoded result. The column decoder block 400 decodes a column address CA outputted from the address buffer block 200, and selects at least one column from columns according to the decoded results.

The control logic block 500 controls general operations of the flash memory device 1000. For example, the control logic block 500 controls a program operation, a read operation, and an erase operation of the flash memory device 1000. The multi-buffer block 600 is controlled by the control logic block 500, and temporarily stores data provided from an external source (e.g., a host). The multi-buffer block 600 has the buffer size large enough for storing the N number of word data. As illustrated in the following detailed description, the multi-buffer block 600 includes a plurality of 2-word buffer circuits. Each of the 2-word buffer circuits is selected by a load address LADD output from the address buffer block 200. Furthermore, 2-word data will be stored in the selected 2-word buffer circuit during a data load interval.

The multi-buffer block 600 scans the number of program data bits in the stored data. Additionally, the multi-buffer block 600 outputs flag signals F_SCAN_OK1 and F_SCAN_OK2 into the control logic block 500 as the scan results. In an exemplary embodiment, the flag signal F_SCAN_OK1 represents whether the loaded data includes a program data bit or not, and the flag signal F_SCAN_OK2 represents that the loaded data do not include the program data bit.

For example, when the flag signal F_SCAN_OK1 is generated as a pulse, the control logic block 500 controls a program operation in a response to activation of the signal F_SCAN_OK1. In particular, the flag signal F_SCAN_OK1 is activated when the loaded data includes at least one program data bit. On the other hand, the flag signal F_SCAN_OK1 is not activated when the loaded data does not include at least one program data bit. When the flag signal F_SCAN_OK2 is generated as a pulse, that is, the loaded data does not include a program data bit, the control logic block 500 terminates a program operation in response to activation of the flash signal F_SCAN_OK2. The flag signal F_SCAN_OK2 is not activated when the loaded data includes at least one program data bit.

A bit line voltage generating block 800 VBL GEN generates a bit line voltage VBL according to the control of the control logic block 500. The write driver circuit 700 is controlled by the control logic block 500, and selectively drives bit lines selected by the column decoder circuit 400 through a bit line voltage VBL. Specifically, the write driver circuit 700 performs this function according to the data from the multi-buffer block 600. For example, when the program data are transmitted, the write drive block 700 drives the bit lines by using the bit line voltage VBL. On the other hand, when program prohibit data are transmitted, the write drive block 700 drives the bit lines by using a ground voltage.

Figure 2:
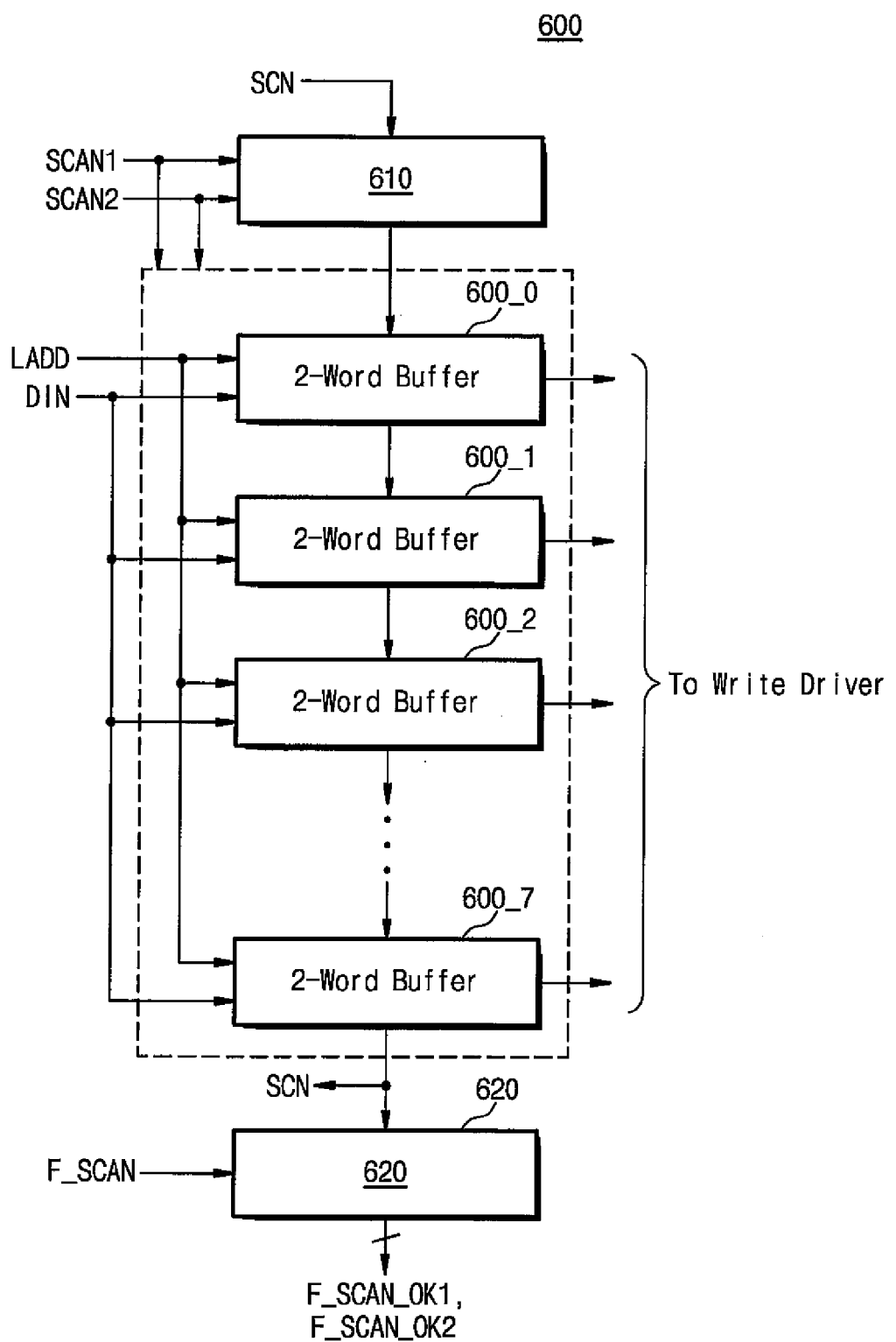
FIG. 2 is a block diagram of a multi-buffer block 600 of FIG. 1 according to an exemplary disclosed embodiment.

FIG. 2 is a block diagram of a multi-buffer block 600 of FIG. 1. For convenience of description, an assumption is made that the multi-buffer block 600 temporarily stores 16-word data. However, it is apparent to those skilled in the art that the present disclosure is not limited to this. For example, the multi-buffer block 600 may temporarily store 32-word data, 64-word data, and 128-word data.

Referring to FIG. 2, the multi-buffer block 600 includes eight 2-word buffer circuits 600_0 to 600_7 to store 16-word data. Each of the 2-word buffer circuits 600_0 to 600_7 stores a 2-word data, that is, 32 data bits. For example, the 2-word buffer circuits 600_0 latches a $0^{th}$ word data DIN when a load address LADD represents the input of a $0^{th}$ word data, and latches a $8^{th}$ word data DIN when a load address LADD represents the input of a $8^{th}$ word data. The 2-word buffer circuits 6001 latches a $1^{th}$ word data DIN when a load address LADD represents the input of a $1^{th}$ word data, and latches a $9^{th}$ word data DIN when a load address LADD represents the input of a $9^{th}$ word data. As described before, the remaining 2-word buffer circuits 600_2 to 600_7 latch $2^{th}$ and $10^{th}$ word data, $3^{th}$ and $11^{th}$ word data, $4^{th}$ and $12^{th}$ word data, $5^{th}$ and $13^{th}$ word data, $6^{th}$ and $14^{th}$ word data, and $7^{th}$ and $15^{th}$ word data, respectively. Consequently, each of the 2-word buffer circuits 600_0 to 600_7 stores 2-word data, that is, 32 data bits.

Referring to FIG. 2, the multi-buffer block 600 includes a multiplexer 610 and a flag signal generating unit 620. The multiplexer 610 represents first and second scan intervals and operates in response to scan start signals SCAN1 and SCAN2 provided from the control logic block 500 of FIG. 1. For example, while the first scan start signal SCAN1 is activated, the multiplexer 610 outputs a value of 0 into the 2-word buffer circuit 600_0 as a previous scan data PRE_SCAN_NUM.

While the second scan start signal SCAN2 is activated, the multiplexer 610 outputs an output value SCN of the 2-word buffer circuit 600_7 into the 2-word buffer circuit 600_0 as a previous scan data PRE_SCAN_NUM. The flag signal generating circuit 620 selectively activates the flag signals F_SCAN_OK1 and F_SCAN_OK2 according to the output value SCN of the 2-word buffer circuit 600_7 after a scan operation of the loaded multi-word data is completed (i.e., when a F_SCAN signal is deactivated).

As mentioned above, the flag signal F_SCAN_OK1 represents whether data in the 2-word buffer circuits 600_0 to 600_7 includes at least one program data bit or not, and is input into the control logic block 500 as the scan result. For example, when the data in the 2-word buffer circuits 600_0 to 600_7 includes at least one program data bit, the flash signal generating circuit 620 activates the flag signal F_SCAN_OK1 and deactivates the flash signal F_SCAN_OK2. On the other hands when the data in the 2-word buffer circuits 600_0 to 600_7 does not include at least one program data bit, the flash signal generating circuit 620 deactivates the flag signal F_SCAN_OK1 and activates the flash signal F_SCAN_OK2.

The control logic block 500 controls program operations in response to the flag signals F_SCAN_OK1 and F_SCAN_OK2. When the data in the 2-word buffer circuits 600_0 to 600_7 does not include at least one program data bit, the flag signal generating circuit 620 deactivates the flag signal F_SCAN_OK1. Accordingly, as mentioned before, the control logic block 500 terminates the program operation in response to the deactivation of the flag signal F_SCAN_OK1.

As described above, the multi-buffer block 600 stores 16-word data. The multi-buffer block 600 performs a scan operation on 8-word data stored in the eight 2-word buffer circuits 600_0 to 600_7 during a first scan interval, and then performs a scan operation on remaining 8-word data in the eight 2-word buffer circuits 600_0 to 600_7 during a second scan interval.

Figure 3:
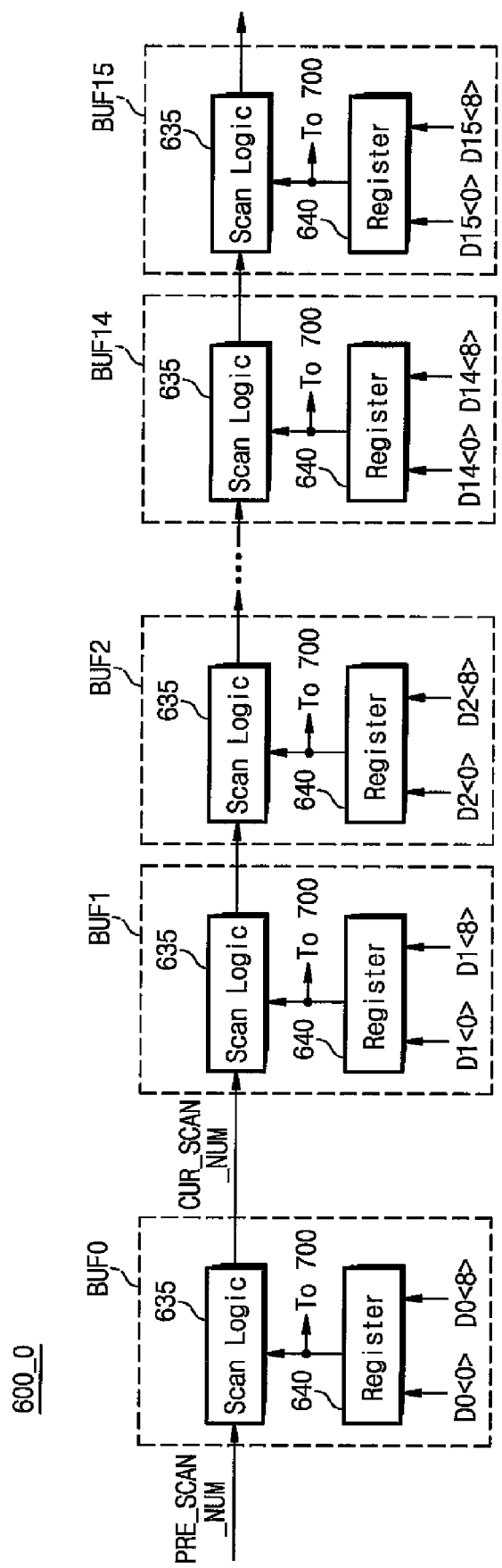
FIG. 3 is a block diagram of a 2-word buffer circuit 600_0 of FIG. 2 according to an exemplary disclosed embodiment.

FIG. 3 is a block diagram of a 2-word buffer circuit 600_0 of FIG. 2. Referring to FIG. 3, the 2-word buffer circuits 600_0 includes 16 buffers BUF0 to BUF15. Each of the buffers BUF0 to BUF15 includes a scan logic 635 and a register 640. Components of the buffers BUF0 to BUF15 operate identically and have same numbers through the drawings. In each of the buffers BUF0 to BUF15, the register 640 stores corresponding data bits among the two word data. For example, the register 640 of the buffer BUF0 latches $0^{th}$ data bit D0<0> in the $0^{th}$ word data and $0^{th}$ data bit D0<8> in the $8^{th}$ word data. The register 640 of the buffer BUF1 latches $1^{th}$ data bit D1<0> in the $0^{th}$ word data and $1^{th}$ data bit D1<8> in the $8^{th}$ word data.

In each of the buffers BUF0 to BUF15, the scan logic 635 increases a value of scan data PRE_SCAN_NUM by one, which is outputted from the previous buffer when the data stored in the corresponding register 640 during a first scan interval are program data, and then outputs the increased value into the next buffer as scan data CUR_SCAN_NUM. Contrarily, the scan logic 635 outputs a value of scan data PRE_SCAN_NUM outputted from the previous buffer into the next buffer as scan data CUR_SCAN_NUM when the data stored in the corresponding register 640 during a first scan interval are program prohibit data.

For example, the scan logic 635 of the buffer BUF0 increases a value, i.e., PRE_SCAN_NUM=0, outputted from the multiplexer 610 of FIG. 2 by one when the data D0<0> stored in the corresponding register 640 during the first scan interval is the program data., and then outputs the increased value into the next buffer BUF1 as scan data CUR_SCAN_NUM. Contrarily, the scan logic 635 of the buffer BUF0 outputs a value, i.e., PRE_SCAN_NUM=0, outputted from the multiplexer 610 of FIG. 2 into the next buffer BUF1 as scan data CUR_SCAN_NUM when the data D0<0> stored in the corresponding register 640 during the first scan interval is the program prohibit data. The remaining buffers operate in a similar fashion, and thus their description will be omitted.

In a multi-buffer block 600, the scan logics 635 of each 2-word buffer circuit constitute a scan data chain which calculates the number of program data bits from the data stored in the registers 640. This calculation is performed at respective first and second scan intervals. In particular, the scan data chain performs a scan operation for an 8-word data D<0> to D<7> during the first scan interval, and also a scan operation for the remaining 8-word data D<8> to D<15> during the second scan interval. Because the scan operation for 2-word data is performed through the one scan logic 635, the area of the multi-buffer block 600 can be reduced.

Figure 4:
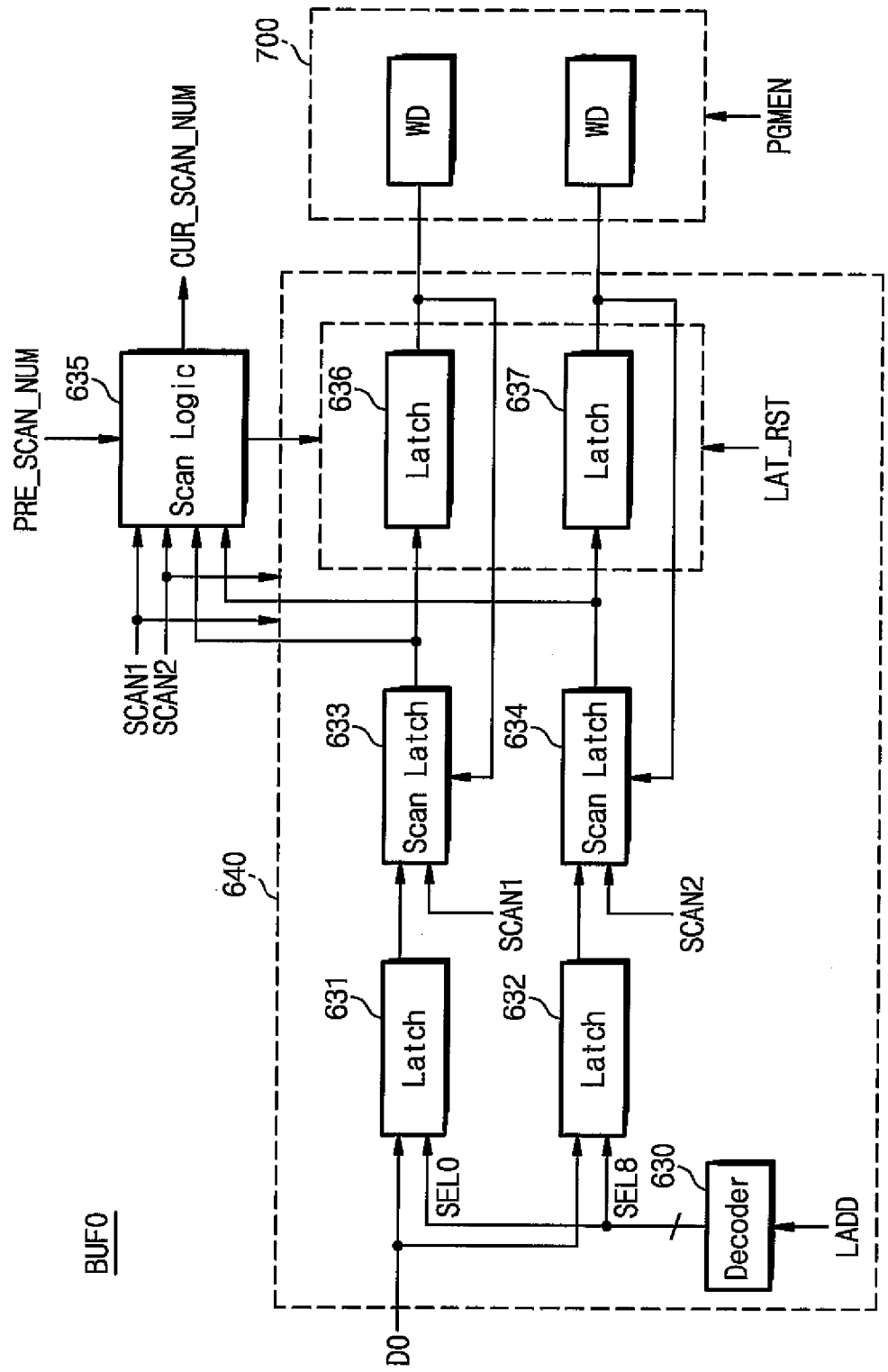
FIG. 4 is a block diagram of an arbitrary buffer BUF0 from FIG. 3 according to an exemplary disclosed embodiment.

FIG. 4 is a block diagram of an arbitrary buffer BUF0 in buffers of FIG. 3. Referring to FIG. 4, the buffer BUF0 in 2-word buffer circuit 600_0 is controlled by the control logic block 500 of FIG. 1. Furthermore, the BUF0 in buffer circuit 600_0 includes the scan logic 635 and the register 640. The register 640 includes a decoder 630, two input latches 631 and 632, two scan latches 633 and 634, and two output latches 636 and 637. As mentioned above, the 2-word buffer circuit latches two word data. Because all buffers in the multi-buffer block 600_0 have the same structure, for convenience of description, only the structure of BUF0 will be described. BUF0 among the buffers in the 2-word buffer circuit of FIG. 4 has a structure that latches one data bit D0<0> among the $0^{th}$ word data and one data bit D0<8> among the $8^{th}$ word data.

The decoder 630 decodes load address LADD inputted during a data load interval to generate select signals SEL0 and SEL8. For example, the decoder 630 activates a select signal SEL8 when the load address LADD represents an input of $0^{th}$ word data. The input latch 631 latches one data bit D0<0> among $0^{th}$ word data in response to a select signal SEL0, and latches one data bit D0<8> among $8^{th}$ word data in response to a select signal SEL8. The scan latch 633 latches the output of the input latch 631 in response to a scan start signal SCAN1 representing a first scan interval, and latches the output of the input latch 632 in response to a scan start signal SCAN2 representing a second scan interval. Furthermore, during the scanning interval, the data latched by the scan latches 633 and 634 are delivered into the output latches 636 and 637, respectively.

In an exemplary embodiment, the scan latches 633 and 634 are electrically connected to the output latches 636 and 637 during a scan interval, and are electrically insulated from the output latches 636 and 637 during a program interval. The output latches 636 and 637 are initialized by an initialize signal at the beginning of the scan interval.

The scan logic 635 operates in response to scan start signals SCAN1 and SCAN2, and calculates the number of program data bits. During the activating interval (i.e., the first scan interval) of the scan start signal SCAN1, the scan logic 635 receives the output of the scan latch 633 and the output PRE_SCAN_NUM of the scan logic 635 in the previous buffer, and adds the input value. For example, the scan logic 635 increases a value PRE_SCAN_NUM outputted from the scan logic 635 in the previous buffer by one when the output of the scan latch 633 is the program data, and then outputs the increased value as scan data CUR_SCAN_NUM. Contrarily, the scan logic 635 outputs a value PRE_SCAN_NUM outputted from the scan logic 635 in the previous buffer as scan data CUR_SCAN_NUM without increasing the value when the output of the scan latch 633 is the program prohibit data. Similarly, during the activating interval of the scan start signal SCAN2, the scan logic 635 receives the output of the scan latch 634 and the output PRE_SCAN_NUM of the scan logic 635 in the previous buffer and selectively adds the input values.

The scan logic 635 controls the output latches 636 and 637 according to the outputs of the scan latches 633 and 634 and scan data PRE_SCAN_NUM from the previous buffer. For example, the scan logic 635 controls the output latch 636 to deliver the data of the output latch 636 into the write driver WD corresponding to the write driver block 700 during the first scan interval when the output of the scan latch 633 is program data, and the value of the previous scan data PRE_SCAN_NUM is smaller than the number of simultaneous program bits. In this case, the scan operation terminates and the scan latch 633 is initialized by the output data of the output latch 636 before performing the program operation. This excludes the program data value of the scan latch 633 at the next scan interval. On the other hand during the first scan interval, the scan logic 635 controls the output latch 636 not to deliver the data of the output latch 636 into a corresponding write driver WD of the write driver block 700 when the output of the scan latch 633 is program data, and the value of the previous scan data PRE_SCAN_NUM is identical or larger than the number of simultaneous program bits. In this case, the scan operation terminates and the scan latch 633 is not initialized by the output data of the output latch 636 before performing the program operation. This reflects the program data value of the scan latch 633 in the next scan interval. During the second scan interval, the scan logic 636 operates identical to that of the first scan interval, and thus its description will be omitted.

Figure 5:
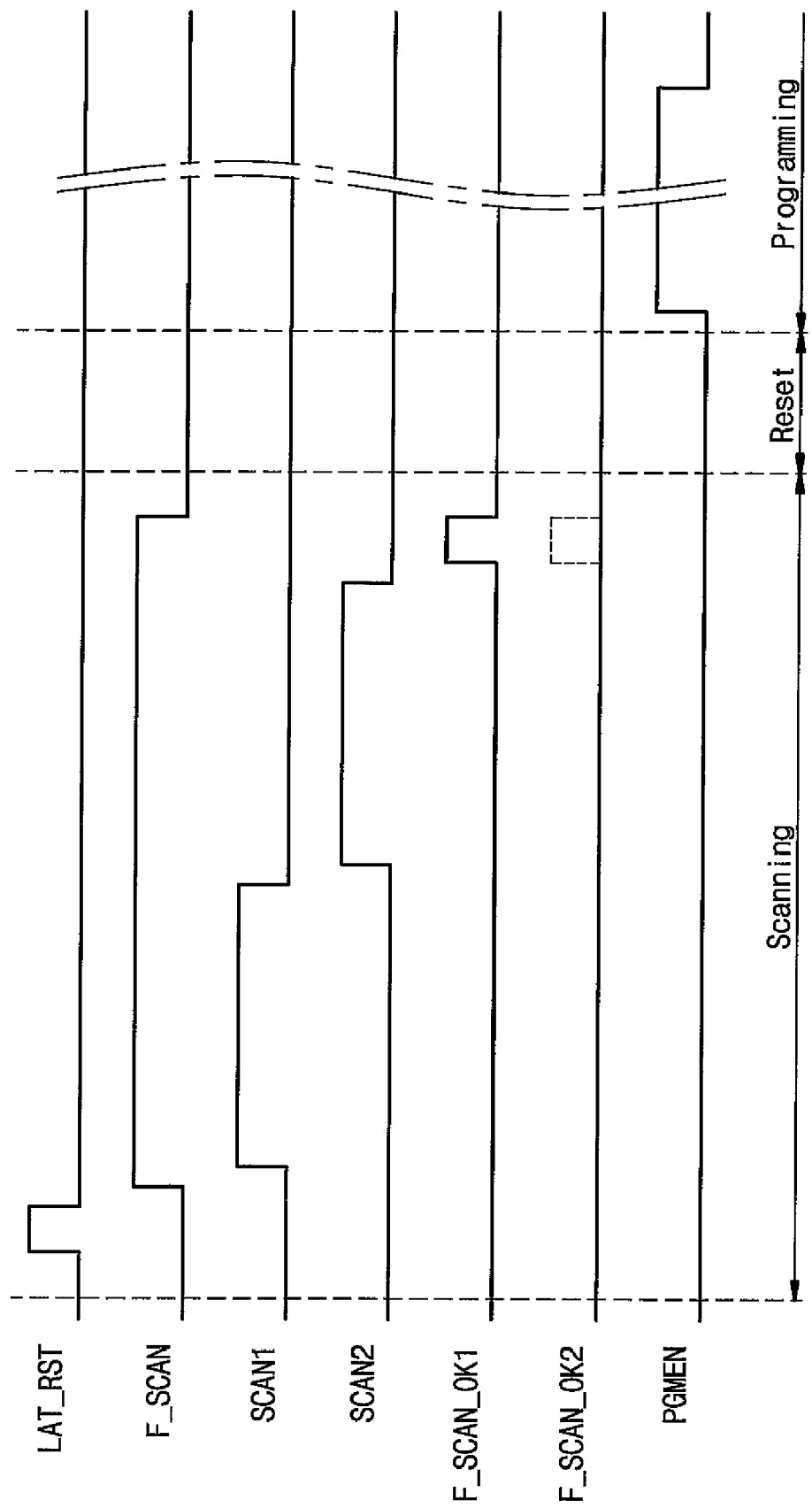
FIG. 5 is a timing diagram illustrating a program data scan operation of a flash memory device according to an exemplary disclosed embodiment.

FIG. 5 is a timing diagram illustrating a program data scan operation of a flash memory device according to an exemplary disclosed embodiment.

Initially, before a data scan operation is performed, a plurality, e.g., 16 word data as program data are loaded into the multi-buffer block 600 under the control of the control logic block 500. To load the data into the multi-buffer block 600, as mentioned above, address information for storing the inputted data is provided. Furthermore, the input data is stored in the 2-word buffer circuit according to the address information. Once 16 word data are loaded into the multi-buffer block 600, the loaded data is programmed into the memory cell array 100 by a predetermined program unit, i.e., a simultaneous program unit (e.g., 4-bit). To perform the program operation by the simultaneous program unit, a program data scan operation is performed to check the number of the program data bits in the loaded data. The program data scan operation is performed during a scan interval, and the scan interval of the present disclosure is divided into the first scan interval and the second scan interval. This will be described in more detail below.

When the scan operations starts, the control logic block 500 activates an initialize signal LAT_RST, and registers 640 in the 2-word buffer circuits 600_0 to 600_7 are initialized by the initialize signal LAT_RST. In FIG. 5, a signal F_SCAN represents a scan interval, and is a flag signal used in the control logic block 500. Once a register initializing operation is completed, as illustrated in FIG. 5, the control logic block 500 activates the first scan start signal SCAN1 in high. As the first scan start signal SCAN1 is activated, data bit stored in the input latch 631 of each 2-word buffer circuit is delivered into the corresponding scan latch 633. As mentioned above, since the scan latch 633 and the output latch 636 are electrically connected during the scan interval, the data of the scan latch 633 is delivered into the output latch 636.

During the first scan interval, i.e., an activating interval of the first scan start signal SCAN1, each scan logic 635 in each of the 2-word buffer circuits 600_0 to 600_7 simultaneously outputs the current scan data CUR_SCAN_NUM according to the previous scan data PRE_SCAN_NUM and the output of the scan latch 633. Specifically, each scan logic 635 increases the value of the previous scan data PRE_SCAN_NUM by one according to the data of the scan latch 633 when the value of the previous scan data PRE_SCAN_NUM is smaller than the number of the simultaneous program bits.

For example, when the value of the previous scan data PRE_SCAN_NUM is smaller than the number of the simultaneous program bits and the data of the scan latch 633 is program data, the scan logic 635 increases the value of the previous scan data PRE_SCAN_NUM by one, and the outputs the increased value into the next buffer as the scan data CUR_SCAN_NUM. At this point, the data (i.e., program data) of the output latch 636 is delivered into the corresponding write driver WD. Furthermore, the scan latch 633 is initialized by the data from the output latch 636 during an initialization interval before the program operation.

If the value of the previous scan data PRE_SCAN_NUM is smaller than the number of simultaneous program bits and the data of the scan latch 633 is program prohibit data, the scan logic 635 outputs the value of the previous scan data PRE_SCAN_NUM into the next buffer as the scan data CUR_SCAN_NUM without any change. If the value of the previous scan data PRE_SCAN_NUM is identical or larger than the number of simultaneous program bits, the scan logic 635 increases the value of the previous scan data PRE_SCAN_NUM by one, and the outputs the increased value into the next buffer as the scan data CUR_SCAN_NUM. In this case, the output of the output latch is not delivered into the write driver according to the control of the scan logic. The buffer receiving the value of the scan data, which is identical to the number of the program bits, outputs the increased scan data according to the output of the scan latch. At this point, the output of the output latch is set as the program prohibit data according to the control of the scan logic in the buffer and the next buffer.

By using the above method, a scan operation is performed on eight 2-word data D<0> to D<7> during the first scan interval. The scan data SCN output from the last 2-word buffer circuit 600_7 is delivered into the multiplexer 610. Specifically, the scan data SCN represents the number of program data bits that are scanned during the first scan interval. Once the first scan interval is completed, the control logic block 600 activates the second scan start signal SCAN2 in high. As the second scan start signal is activated in high, the scan data SCN is provided through the multiplexer 610 in the buffer BUF0 of the 2-word buffer circuit 600_0.

During the activation interval of the second scan start signal SCAN2, each scan logic 635 in each of the 2-word buffer circuits 600_0 to 600_7 simultaneously outputs the current scan data CUR_SCAN_NUM according to the previous scan data PRE_SCAN_NUM and the output of the scan latch 634. When the value of the previous scan data PRE_SCAN_NUM is less than the number of the simultaneous program bits, each scan logic 635 increases the value of the previous scan data PRE_SCAN_NUM by one, and then outputs the increased value into the next buffer as the scan data CUR_SCAN_NUM. At this point, the data of the output latch 637 (i.e., program data) is delivered into the corresponding write driver WD.

If the value of the previous scan data PRE_SCAN_NUM is smaller than the number of the simultaneous program bits and the data of the scan latch 634 is the program prohibit data, the scan logic 635 outputs the previous scan data PRE_SCAN_NUM into the next buffer as the scan data CUR_SCAN_NUM without change. When the value of the previous scan data PRE_SCAN_NUM is identical to or larger than the number of simultaneous program bits and the data of the scan latch 634 is program data, the scan logic 635 increases the value of the previous scan data PRE_SCAN_NUM by one and the outputs the increased value into the next buffer as the scan data CUR_SCAN_NUM.

By using the above-described method, a scan operation is performed on eight 2-word data D<8> to D<15> during the second scan interval. The scan data SCN outputted from the last 2-word buffer circuit 600_15 is delivered into the flag signal generating circuit 620. At this point, the scan data SCN represents the number of the program data bits scanned during the first and second scan intervals. The flash signal generating circuit 620 selectively generates flash signals F_SCAN_OK1 and F_SCAN_OK2 according to the scan data SCN when a scan operation is completed (or, a signal F_SCAN has a high to low change). For example, when there is least one program data bit in the data stored in the multi-buffer block 600, the flag signal generating circuit 620 activates the flag signal F_SCAN_OK1. At this point, the control logic block 500 activates the program enable signal PGMEN in response to the activation of the flag signal F_SCAN_OK1. This allows the write driver block 700 to selectively drive the bit lines by the bit line voltage VBL according to the data outputted from the multi-bit block 600. Contrarily, when there is no program data bit in the data stored in the multi-buffer block 600, the flash signal generating circuit 620 deactivates the flag signal F_SCAN_OK1 and activates the flash signal F_SCAN_OK2 illustrated using a dotted line of FIG. 5. The control logic block 500 terminates the program operation in response to the activation of the flag signal F_SCAN_OK2.

As illustrated in FIG. 5, a scan operation terminates and a reset operation is performed before the program operation. During a reset interval, the scan latches 633 and 634 of the multi-buffer block 600 are selectively initialized by using the above method. That is, when the outputs of the scan latch 633 and 634 are program data and the value of the previous scan data PRE_SCAN_NUM is smaller than the number of the simultaneous program bits, the scan latches 633 and 634 are initialized by the output data of the output latches during an initialization interval. This excludes the program data value of the scan latches 633 and 634 at the next scan interval. On the other hand, when the output of the scan latches 633 and 634 are program data and the value of the previous scan data PRE_SCAN_NUM are identical to and larger than the number of simultaneous program bits, the scan latches 633 and 634 are not initialized by the data of the output latches 636 and 637.

Figure 6:
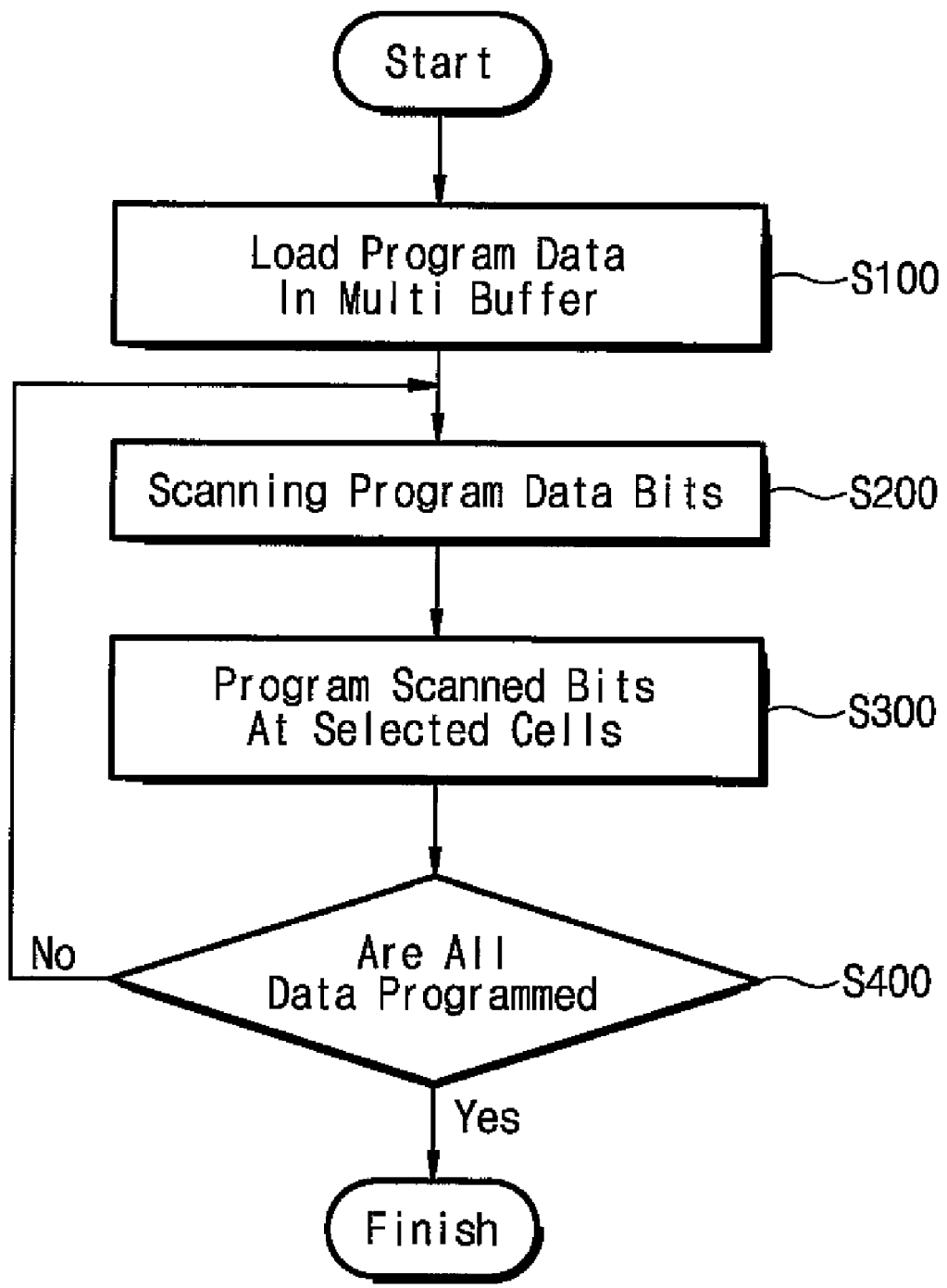
FIG. 6 is a flowchart illustrating a program operation of a flash memory device according to an exemplary disclosed embodiment.

FIG. 6 is a flowchart illustrating a program operation of a flash memory device according to the present invention.

Referring to FIG. 6, the program data are loaded into the multi-buffer block 600 in operation S100. Once the data are loaded into the multi-buffer block 600, a scan operation for data loaded using, for example, the above method of FIG. 5 is performed in operation S200. The scanned program data bits are programmed into selected memory cells in operation S300. Once the program operation for the scanned program data bits is completed, it is determined whether all the data is programmed or not in operation S400. When all the data are programmed, the program procedure is terminated. However, when all the data is not programmed, the process proceeds to operation 200. It is apparent to those skilled in the art that a scan operation is performed after performing a program operation, or a scan operation is performed during a program operation.

Figure 7:
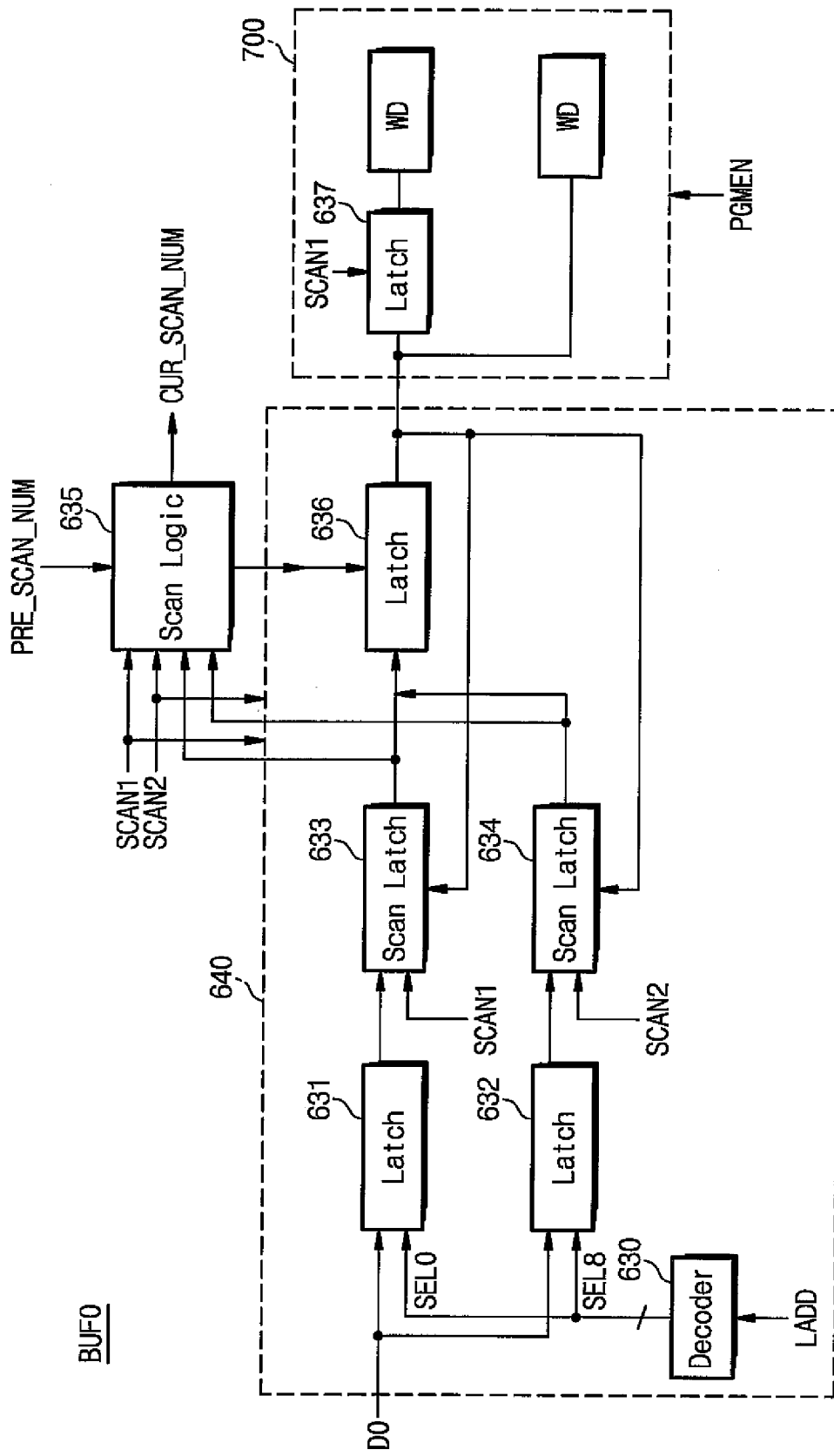
FIG. 7 is a block diagram of a flash memory device according to an alternative exemplary disclosed embodiment.

The number of data bus lines that electrically connect the multi-buffer block 600 and the write driver block 700 are identical to the number of program data bits. For example, when the 16-word data is stored in the multi-buffer block 600, the data bus between the multi-buffer block 600 and the write driver block 700 includes 16-word data, i.e., 256 lines. Contrarily, as illustrated in FIG. 7, the number of the bug lines can be reduced to the half by using the output of the register 640 as the input latch of the write driver WD. In this case, the output latch 636 of the register 640 is used as the input latch of another write driver WD. The latch 637 of the write driver block 700 latches the data outputted from the register 636 during the first scan interval. Except this point, the buffer BUF0 and the write drive block 700 in FIG. 7 operate actually identical to the above description, and thus its description will be omitted.

As describe above, a scan operation for 2-word data is performed by using one scan logic, thereby minimizing the layout area of a multi-buffer block.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising a memory cell array, and a multi-buffer block which temporarily stores program data that are to be stored in the memory cell array, wherein the multi-buffer block includes a plurality of buffer circuits which store at least 2-word data, respectively, and wherein each of the buffer circuits comprises:
   a plurality of registers which store two corresponding data bits among the at least 2-word data, respectively; and
   scan logics corresponding to the registers, respectively, which scan a number of program data of a first word data among the at least 2-word data during a first scan interval, and which scan a number of program data of a second word data among the at least 2-word data based on the number of the program data of the first word data during a second scan interval.

2. The flash memory device of claim 1, wherein each of the registers comprises:
   first and second input latches which latch the two corresponding data bits, respectively, among the at least 2-word data;
   a first scan latch which latches an output of the first input latch in response to a first scan start signal notifying the first scan interval;
   a second scan latch which latches an output of the second input latch in response to a second scan start signal notifying the second scan interval;
   a first output latch controlled by a corresponding scan logic and which latches an output of the first scan latch; and
   a second output latch controlled by a corresponding scan logic and which latches an output of the second scan latch.

3. The flash memory device of claim 2, wherein each of the scan logics operates in response to the first scan start signal, increases output of a previous scan logic according to the output of the first scan latch, and outputs the increased value to a next scan logic as a number of program data bits.

4. The flash memory device of claim 3, wherein each of the scan logics operates in response to the second scan start signal, increases output of a previous scan logic according to the output of the second scan latch, and outputs the increased value to a next scan logic as a number of program data bits.

5. The flash memory device of claim 4, further comprising:
   a control logic; and
   a write driver block controlled by the control logic and which drives bit lines of the memory cell array in response to outputs of the first and second output latches of the respective registers.

6. The flash memory device of claim 5, wherein the multi-buffer block further comprises a signal generating circuit which generates first and second flag signals in response to an output of a final buffer circuit among the buffer circuits after a data scan operation of the stored program data is completed.

7. The flash memory device of claim 6, wherein the control logic controls the write drive block in response to the first flag signal which represents that the stored program data includes at least one program data bit.

8. The flash memory device of claim 6, wherein the control logic terminates a program operation in response to the second flag signal which represents that the stored program data includes no program data bit.

9. The flash memory device of claim 2, wherein the each of the registers comprises:
- first and second input latches which latch two corresponding data bits, respectively, among the 2-word data;
- a first scan latch which latches an output of the first input latch in response to a first scan start signal notifying the first scan interval;
- a second scan latch which latches an output of the second input latch in response to a second scan start signal notifying the second scan interval; and
- an output latch controlled by a corresponding scan logic, which latches an output of the first scan latch during the first scan interval, and which latches an output of the second scan latch during the second scan interval.

10. The flash memory device of claim 9, further comprising:
- an input latch which latches an output of the output latch during the first scan interval;
- a first write driver driving a corresponding bit line in response to an output of the input latch during a program interval; and
- a second write driver driving a corresponding bit line in response to an output of the output latch during the program interval.

* * * * *